United States Patent [19]

Swart

[11] Patent Number: 5,416,428
[45] Date of Patent: May 16, 1995

[54] MARKER PROBE
[75] Inventor: Mark A. Swart, Upland, Calif.
[73] Assignee: Everett Charles Technologies, Inc., Pomona, Calif.
[21] Appl. No.: 10,981
[22] Filed: Feb. 9, 1993
[51] Int. Cl.⁶ .......................... G01R 1/06; G01R 31/02
[52] U.S. Cl. ...................................... 324/759; 324/761
[58] Field of Search ............... 324/158 P, 158 F, 72.5, 324/759, 754, 761

[56] References Cited

U.S. PATENT DOCUMENTS

| | | | |
|---|---|---|---|
| 2,238,304 | 4/1941 | Belanger | 409/178 |
| 2,654,407 | 10/1953 | Dremel | 81/475 |
| 3,345,567 | 10/1967 | Turner et al. | 324/158 P |
| 3,437,929 | 4/1969 | Glenn | 324/158 P |
| 4,568,879 | 2/1986 | Nakamura et al. | 324/158 F |

FOREIGN PATENT DOCUMENTS 0873104 10/1981 U.S.S.R. .

Primary Examiner—Ernest F. Karlsen
Attorney, Agent, or Firm—Christie, Parker & Hale

[57] ABSTRACT

A test fixture for testing printed circuit boards comprises an array of electrically conductive test probes mounted within the fixture, a marker probe mounted for contact with the board, and a marker probe drive motor for rotating the marker probe in response to an input signal from a circuit board tester. During testing, the test probes contact the board to produce a test signal indicating pass/fail status of the board. At the same time the marker probe is drawn into spring-biased contact with the board. For each board that passes the test, the test signal operates the drive motor for a short time interval to rotate the marker probe to apply an identifying mark to the board, indicating that the board has passed the test. In one embodiment, the marker probe includes a plunger on an output shaft of the drive motor, in which the marker probe is secured to the plunger eccentric to the motor shaft axis of rotation. A spring biases the plunger when the plunger moves axially relative to the motor output shaft, thereby producing spring biased contact between the marker probe and the board. Operation of the drive motor rotates the plunger and thereby rotates the eccentrically mounted marker probe which is held in spring-biased contact with the board. This produces a permanent identifying mark on the board, preferably by the marker probe being rotated for a fraction of a second, which removes a small area of the board's plastic coating to expose the underlying copper layer that provides the permanent and easily visible mark on the board.

17 Claims, 5 Drawing Sheets

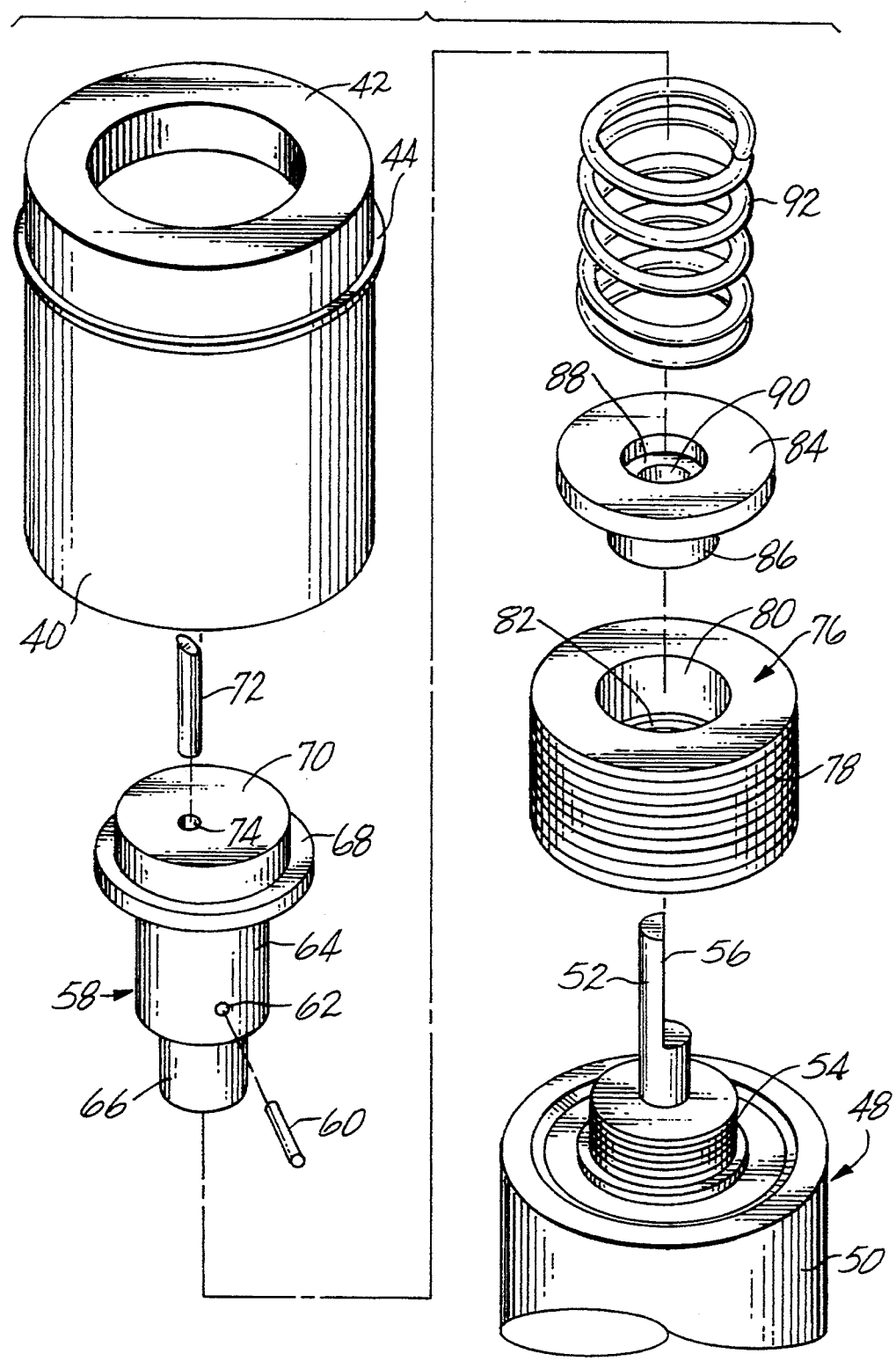

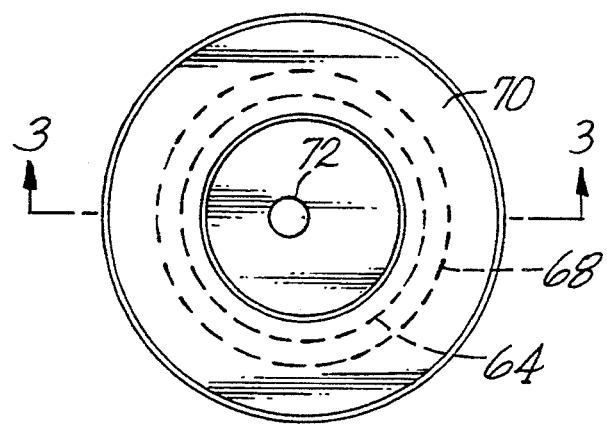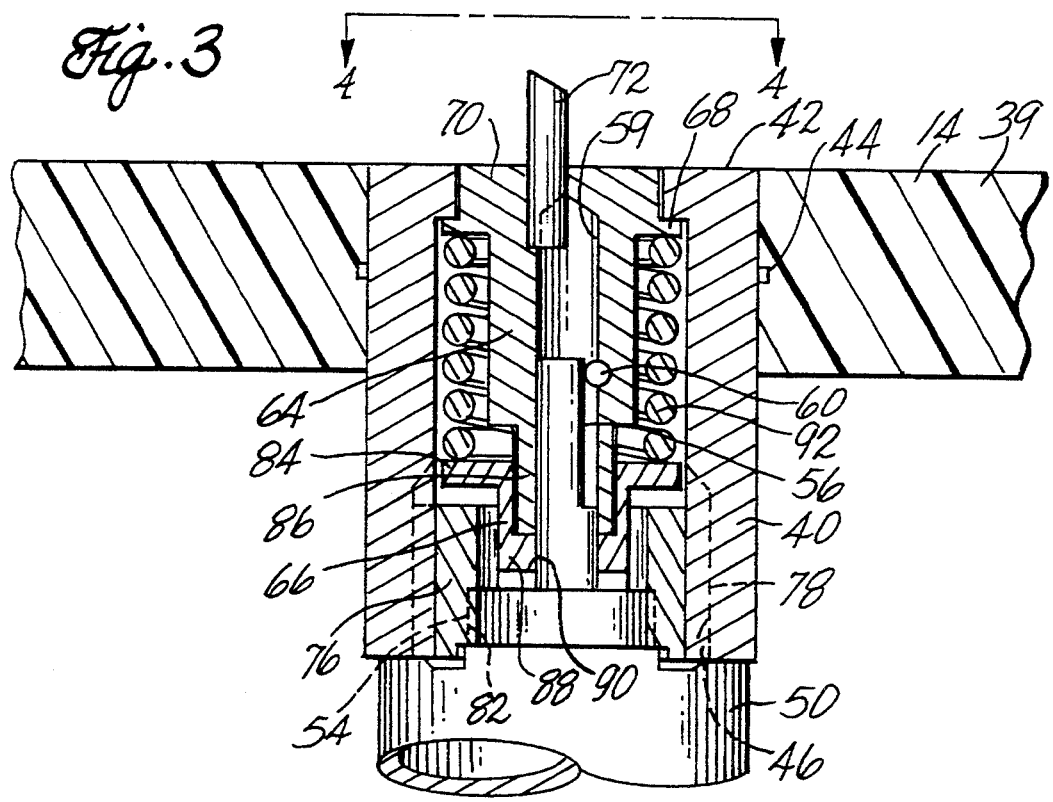

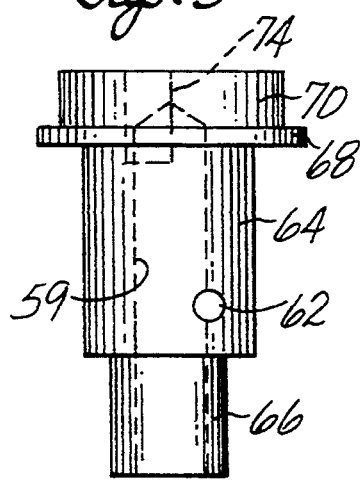
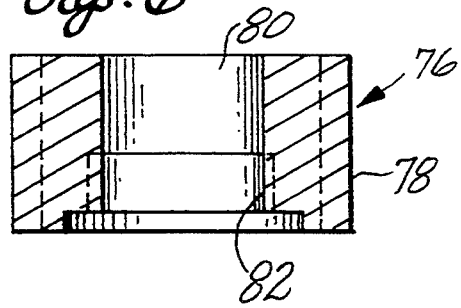
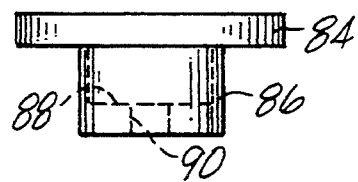

MARKER PROBE

FIELD OF THE INVENTION

This invention relates to test fixtures for use in computerized automatic test equipment for checking printed circuit boards, and more particularly, to the use of a marker probe adapted to place an identifying mark on each board tested on the fixture, depending upon the board's pass/fail status as a result of the test.

BACKGROUND OF THE INVENTION

Automatic test equipment for checking printed circuit boards has long involved use of a large number of spring-biased test probes arranged in a test fixture to make electrical contact under spring pressure with designated test points on the circuit board under test. Any particular circuit laid out on a printed circuit board is likely to be different from other circuits, and when the circuit to be tested is designed, a pattern of test points to be used in checking it is selected, and a corresponding array of test probes is configured in the test fixture. This typically involves drilling a pattern of holes in a probe plate to match the customized array of test probes and then mounting the test probes in the drilled holes on the probe plate. The circuit board is then mounted in the test fixture during testing, superimposed on the array of test probes. During testing, the spring loaded test probes are brought into spring pressure contact with the test points in the circuit board under test. Electrical test signals are then transferred from the board to the test probes and then to the exterior of the fixture for communication with a high speed computer operated electronic test analyzer which detects continuity or lack of continuity between various test points in the circuits on the board. At the end of each test, the test unit produces a pass/fail signal to indicate that the board has either passed or failed the test.

It has been common in the prior art for the operator to visually monitor a display or other means for indicating the results of the pass/fail test. The operator then manually separates the good boards from the bad boards. The good boards may be identified by manually stamping an identifying mark on the board. This approach leads to human error; experience has shown that some boards that have been tested will end up in the wrong group of boards.

Thus, it is desirable to provide a system for separating good boards from bad boards that leaves no room for human error. The procedure for identifying the good boards and bad boards should be accomplished not only with complete reliability, but also with minimal delay time in the testing process. In addition, any procedure for identifying the good boards should be done in such a way that an identifying mark on the board is permanent so it can distinguish the good boards from those that failed the test with 100% reliability.

SUMMARY OF THE INVENTION

Briefly, one embodiment of the invention comprises a test fixture for testing printed circuit boards, in which an array of electrically conductive test probes are mounted within the fixture, and a marker probe also mounted in the fixture is arranged for contact with the board. A marker probe drive motor rotates the marker probe in response to an input signal from an external circuit board tester. During testing, the test probes are drawn into contact with the board under test to contact the board and produce a test signal indicating that the board either passes or fails the test. At the same time, the marker probe is drawn into spring-biased contact with the board. For each board that passes the test, the test signal automatically generated by the test unit is used to operate the marker probe drive motor for a short time interval, to rotate the marker probe momentarily while it contacts the board, for applying an identifying mark to the board to indicate that the board has passed the test.

In one embodiment, the marker probe is part of an assembly which comprises a plunger that makes a sliding fit on an output shaft of the marker probe drive motor. The marker probe is secured to the plunger eccentric to the motor shaft axis of rotation. A biasing spring contacts the plunger to bias the plunger when the plunger slides axially relative to the output shaft of the motor. This produces spring biased contact between the marker probe and the board. The plunger is secured to the motor output shaft so that operation of the drive motor rotates the plunger and thereby rotates the eccentrically mounted marker probe which is held in spring biased contact with the board. The marker probe, in one embodiment, comprises a cutting tool with a chisel tip, and the marker probe is rotated, preferably for a fraction of a second, to cut a permanent identifying mark in the board surface. This identifying mark is preferably produced by the chisel tip of the probe being rotated, while in spring pressure contact with the board, to remove a small shallow two-dimensional area from the plastic coating on the board. This exposes an underlying copper layer of the board to provide a small, permanent, easily visible identifying mark on the board.

Thus, the marker probe is used with the array of test probes in the test fixture when conducting a test on each board, and the marker probe automatically forms an identifying mark on each board that passes the test as part of the same test cycle for the board. Each board is identified within a fraction of a second after passing the test, and good and bad boards are easily identified for segregation by the permanent identifying marks. The invention avoids additional processing steps or delay time that be necessary to visually monitor and manually mark or otherwise identify boards that have passed or failed the test. The system is therefore more reliable than the prior art procedure of separating good boards from bad boards in response to monitoring a pass/fail display, since the human error potential for bad boards being mixed up with good boards is eliminated.

These and other aspects of the invention will be more fully understood by referring to the following detailed description and the accompanying drawings.

BRIEF DESCRIPTION OF THE DRAWINGS

FIG. 2 is an exploded perspective view illustrating components of the marker probe assembly.

FIG. 3 is a fragmentary cross-sectional view illustrating the components of FIG. 2 assembled in a marker probe used in an alternative type of test fixture for testing populated circuit boards. This figure illustrates a further type of test fixture on which the marker probe can be used.

FIG. 4 is a top view taken on line 4—4 of FIG. 3.

FIG. 5 is a front elevational view showing a plunger used in the marker probe assembly.

FIG. 6 is a cross-sectional view showing a bushing used in the marker probe assembly.

FIG. 7 is front elevation view showing a thrust washer and spacer used in the marker probe assembly.

DETAILED DESCRIPTION

Figure 1:
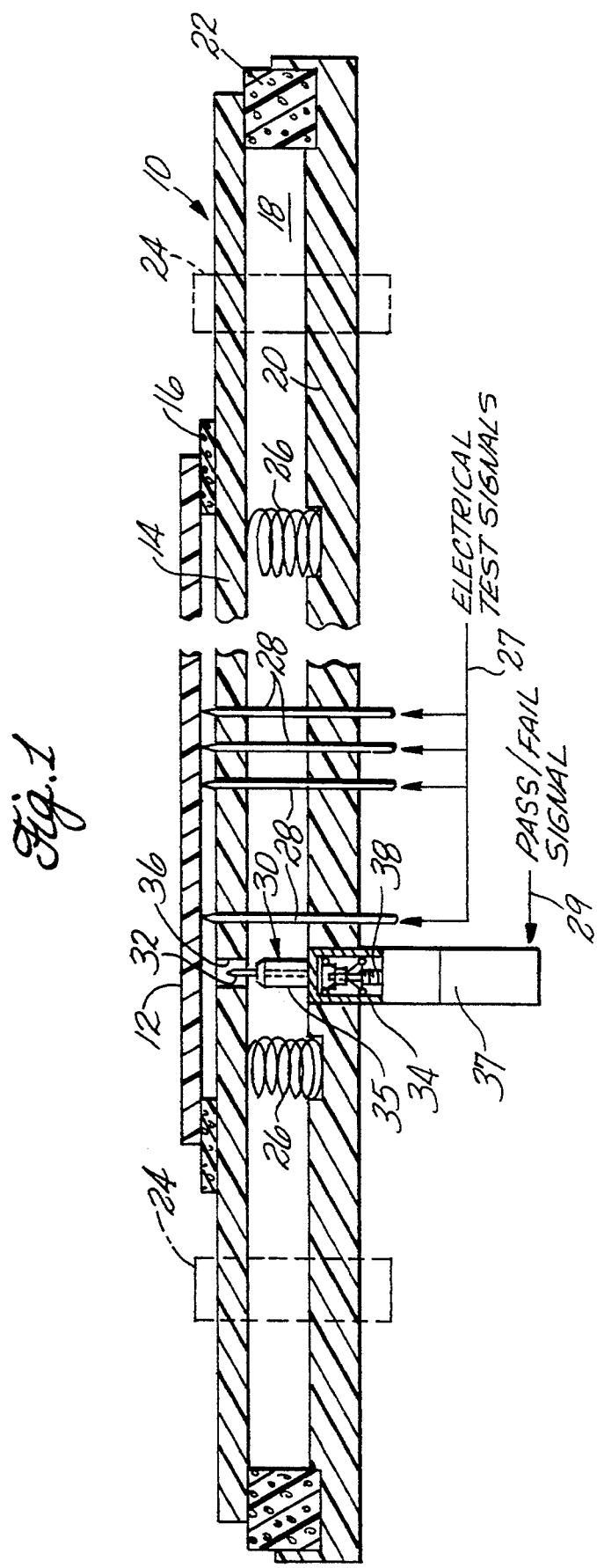
FIG. 1 is a fragmentary, semi-schematic cross-sectional view illustrating components of a printed circuit board test fixture containing a marker probe assembly according to principles of this invention. The fixture depicted in this drawing is one embodiment of a bare board test fixture which illustrates one type of test fixture on which the marker probe can be used.

Referring to FIG. 1, a test fixture 10 mounts a printed circuit board 12 for testing on the fixture. The test fixture 10 is one example of a fixture on which the invention can be used. FIG. 3, for example, shows an alternative test fixture on which the invention also can be used. The test fixture 10 is a fixture typically used for testing bare boards, and the fixture includes a moving top plate 14 that supports the board under test. A compressible peripheral seal 16 on the top surface of the moving top plate supports the board above and spaced from the top plate. The seal 16 provides an air-tight gasket for sealing against a vacuum formed within a hollow vacuum cavity 18 of the fixture when the fixture is used for testing the board. The board under test is also mounted with the use of tooling pins (not shown) for accurately positioning the board and maintaining its position on the top plate during testing.

The fixture also includes a stationary rigid probe plate 20 spaced below and extending parallel to the moving top plate. A compressible outer peripheral gasket seal 22 affixed to the probe plate supports the outer perimeter of the moving top plate. The top plate rests on the gasket seal which forms an air-tight seal around the perimeter of the vacuum cavity 18. This allows the top plate to be compressed on the gasket seal as it moves toward the fixed probe plate during testing. A vacuum drawn within the vacuum cavity 18 during testing moves the top plate toward the probe plate. Linear bearings (shown in phantom lines at 24 in the corners of the test fixture) guide the vertical travel of the top plate relative to the probe plate. Spaced-apart compression springs 26 supported on the probe plate contact the underside of the top plate and provide controlled spring-biased travel of the top plate toward and away from the stationary probe plate.

An array of electrically conductive spring-biased test probes 28 are mounted in the probe plate for contact with the underside of the board under test. The test probes are mounted in a pattern of holes drilled in the probe plate corresponding to a pattern of test points on the board under test. A corresponding hole pattern is also drilled in the moving top plate, and the test probes extend through the corresponding holes in the top plate for contact with the board 12. A vacuum inlet (not shown) to the vacuum cavity 18 is coupled to an external vacuum source, so that during testing, the vacuum drawn on the vacuum cavity pulls the top plate down toward the probe plate, compressing the vacuum seals 16 and 22 while drawing the test probes 28 into pressure contact with the circuits on the board under test. The individual test probes are electrically connected to a computerized automatic test verification unit (not shown) external to the test fixture. The test unit provides a means of high-speed testing of the circuits on the board contacted by the test probes. The automatic test verification unit operates in response to electrical test signals 27 received from the test probes contacting the board under test and produces a pass/fail test signal 29 which is commonly used for activating a display on the automatic test equipment. A visual display (not shown) is electrically coupled to the pass/fail signal produced by the tester for visually indicating the test results. The pass/fail display is normally monitored by an operator who can then remove the board from the test fixture when the test is completed and either put the board in a stack of boards that have passed the test, or in another stack of boards that have failed the test. This approach of visually identifying the boards that have passed the test and manually segregating them is avoided by the present invention.

One embodiment of the present invention provides a marker probe assembly 30 for automatically and selectively forming an identifying mark on the board at the time the board is tested. The identifying mark produced by the marker probe provides a permanent and visual means of identifying whether each board has passed or failed the test. FIG. 1 schematically depicts the marker probe assembly in an arrangement adapted to the particular type of bare board fixture shown in FIG. 1. This marker probe assembly 30 is shown exaggerated in size for clarity. The assembly includes a marker pin 32 that contacts the board during testing. A marker probe housing 34 is rigidly secured to the probe plate 20. The housing holds an extension 35 that mounts the marker probe. The extension is aligned with a hole 36 in the moving top plate. A marker probe drive motor 37 has an output shaft 38 extending from the motor into the marker probe housing for rotating the marker pin 32 in response to the pass/fail signal 29 input to the drive motor 37. When the vacuum is used to actuate the fixture, the top plate is compressed toward the marker probe and the probe tip 32 makes spring biased contact with the underside of the board to form an identifying mark on the board. The marker probe assembly depicted in FIG. 1 is schematic only; its preferred arrangement of component parts is shown in more detail in FIGS. 2-7.

FIG. 2 is an exploded perspective view illustrating components of the marker probe assembly 30. FIG. 3 is a cross-sectional view illustrating the assembly of components shown in FIG. 2, and FIGS. 4-7 show further elevational views of components of the marker probe assembly. FIG. 3 also depicts an alternative arrangement of the marker probe as used in a test fixture for testing populated circuit boards. In this type of fixture a rotatable lid mounts the spring probes (such as spring probes 28) and the marker probe assembly, including its drive motor. The rotatable lid is shown schematically at 39 in FIG. 3. During use, the lid is closed over a board mounted inside the fixture and a vacuum is produced inside the fixture housing to draw the test probes (and the marker probe) into contact with the board. Referring to FIG. 2, the marker probe assembly includes a cylindrical outer housing 40 press-fitted in the lid 39 of the test fixture. A hollow interior region contained within the outer housing 40 contains assembled components of the marker probe assembly. An annular top surface 42 of the housing is mounted flush with the top surface of the lid 39. No extension, such as the extension 35 shown in FIG. 1, is used in this test fixture embodiment. An outer annular ring 44 projects from the outside diameter of the housing for securing the housing 40 in a fixed position in the lid 39. The bottom portion of the housing projects away from the vacuum cavity formed within the fixture. An externally threaded inside surface 46 extends along the lower inside portion of the outer housing. The housing fits over the top of a gear motor 48 which includes a motor housing 50 and an elongated output shaft 52 projecting from a gear box section of the drive motor. The motor output shaft has a fixed externally threaded base 54. A recessed flat section 56 extends along one end portion of the output shaft. The motor output shaft rotates in bearings relative to the fixed base 54.

A sliding plunger 58 makes a slip fit over the motor output shaft 52. The plunger has a hollow axial interior passage 59 that slides over the motor output shaft. A cross pin 60 couples rotary motion from the motor output shaft to the sliding plunger body. The cross pin fits into a transverse passage 62 in a cylindrical main body portion 64 of the movable plunger. The pin engages the flat surface 56 of the motor output shaft to fasten the plunger body to the motor output shaft so that the plunger rotates with the motor shaft when the motor is driven. The cross pin also facilitates sliding non-rotational travel of the plunger along the motor output shaft. The plunger further includes a reduced diameter lower portion 66 which fits around a lower portion of the motor output shaft. An annular flange 68 projects from the main body portion of the plunger, and a cylindrical top portion 70 supports a pressed-in metal marking pin 72. The pin is preferably made from a hard carbide steel and has an angular chisel tip for cutting into an outer surface layer of the printed circuit board, as described in more detail below. The marker pin is pressed into a hole 74 carried in the upper portion 72 of the plunger body. The hole 74 and the marker pin 72 are offset radially from the plunger axis of rotation.

The marker probe assembly further includes a cylindrical bearing 76 having an externally threaded outer surface 78 and a cylindrical bore 80 with an internally threaded lower inside diameter 82. The externally threaded surface 70 of the bushing 68 threads into the threaded lower portion 46 of the outer housing 40. The internally threaded lower inside portion 82 of the bore in the bushing is threaded onto the threaded lower portion 54 of the motor output shaft 52. The bushing 76 is secured to the fixed base 54 of the motor shaft by engaging the threaded lower inside portion of the bore 82 in the bushing with the externally threaded base 54 of the motor. The outer housing 40 is fastened to the bushing by engaging the internally threaded lower portion 46 of the housing with the externally threaded outer surface 78 of the bushing. Thus, the housing 40, the bushing 76 and the motor housing 50 are rigidly held together as a fixed unit, mounted to the rotatable lid 39 of the test fixture.

A thrust washer 84 acts as a spacer and a travel stop for the slidable plunger 58. The thrust washer 84 carries a cylindrical lower body 86 a reduced cross section which makes a slip fit around the lower portion of the motor output shaft 52. An inwardly projecting lower flange 88 inside the thrust washer acts as the travel stop for the lower portion 66 of the sliding plunger body. The thrust washer is mounted above the top surface of the bearing 76, and a bore 90 in the lower portion 86 of the thrust washer makes a slip fit around the motor output shaft in assembly. The thrust washer is fixed and does not rotate with rotation of the motor shaft 52.

A compression spring 92 extends around the outside of the plunger body, between the flange 68 on the top portion of the plunger and the top surface of the thrust washing 84.

The motor housing 50 and the outer housing 40 of the marker probe are secured together as a small rigid unit and held in a fixed position in the lid 39. The plunger 58 is slidable axially on the motor output shaft 52, controlled by the bias of the return spring 92; but the plunger is also pinned to the output shaft, so that when the motor is driven, the plunger rotates with the motor shaft. The base of the fixed thrust washer 84 acts as a stop against axial spring biased travel of the plunger into the marker probe housing. The marker pin 72 is adapted for contact with the board under test, preferably in a peripheral region of the board where and identifying mark can be easily visible. The marker pin contacts the board simultaneously when the test probes 28 also carried by the lid 39 are drawn into spring pressure contact with the board during testing. In either test fixture embodiment (either that of FIG. 1 or FIG. 3), the board is moved toward the marker probe tip which normally causes the plunger 58 to move into the marker probe housing against the bias of the return spring 92. While the return spring pressure is maintained on the marker probe tip, the motor actuated by a pulse type output signal from the pass/fail tester (if a "pass" signal is generated) to rotate the marker probe about its axis momentarily for applying a mark to the board.

Figure 8:
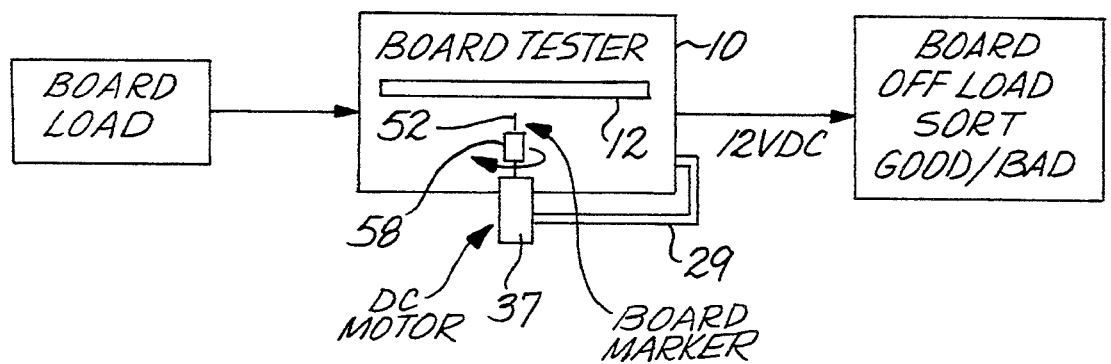
FIG. 8 is a schematic block diagram illustrating a process for using the marker probe of this invention.

FIG. 8 illustrates a typical arrangement for conducting high speed testing and marking of circuit boards 12. Each board is loaded into the test fixture 10 and the test is conducted while the marker probe 52 simultaneously contacts the board. If the board passes the test, a 12 volt DC output signal 29 is generated and coupled to the drive motor 37 for rotating the eccentrically mounted and spring biased marker probe 52 for cutting a small identifying mark into the surface coating of the board. The board is then off-loaded and the permanently identified good boards are separated from those that do not pass the test.

To summarize, during testing the test probes 28 contact the board to produce the test signal 29 indicating the pass/fail status of the board. At the same time, the marker probe is drawn into spring-biased contact with the board. For each board that passes the test, the test signal that indicates "pass" operates the drive motor for a short time interval to rotate the marker probe to apply an identifying mark to the board. The plunger on the output shaft of the drive motor holds the marker probe in spring biased contact with the board, and the marker probe is secured to plunger to rotate about an axis eccentric to the motor shaft axis of rotation. Operation of the drive motor rotates the eccentrically mounted chisel tip of the marker probe over a small two-dimensional circular area that produces a permanent identifying mark on the board. The marker probe is preferably rotated for a time interval sufficient to remove a small circular area of the board's plastic coating to a controlled depth that exposes the underlying copper layer that provides the permanent and easily visible identifying mark on the board. The motor is then immediately stopped before further penetration of the board is produced by the marker probe. The length of time that the rotating spring biased marker probe remains operational controls the depth of penetration of the identifying mark in the board. The spring pressure applied to the marker probe also can control depth of cutting. The radial distance that the cutting tip is offset from the motor output shaft axis of rotation is proportional to the diameter of the small circular mark produced on the surface of the board; i.e., the larger the offset, the greater the diameter of the identifying mark.

What is claimed is:

1. A test fixture for testing printed circuit boards, comprising:

a housing;

an array of electrically conductive test probes mounted within the housing and defining a test probe field;

a support plate on the housing for mounting a printed circuit board in alignment with the test probe field;

means for drawing the test probes and the supported printed circuit board toward each other and into contact for testing, said contact producing an electrical test signal indicating that the board either passes or fails the test;

a marker probe mounted in the housing within the test probe field for contact with the board;

spring biasing means on the marker probe for biasing the marker probe into spring contact with the board; and marker probe drive means for rotating the marker probe, the drive means being responsive to the test signal for operating the drive means when the test signal indicates a specific pass/fail status of the tested printed circuit board, operation of the drive means causing the marker probe to rotate while under spring biased contact with the board for forming an identifying mark on the surface of the board to indicate the specific pass/fail status of the tested circuit board.

2. Apparatus according to claim 1 in which the drive means comprises a drive motor with an output shaft that rotates about an axis, and in which the marker probe rotates about an eccentric axis relative to the axis of rotation of the drive motor output shaft to form the identifying mark on the board with a diameter related to the offset spacing of the marker probe relative to the output axis of the motor output shaft drive.

3. Apparatus according to claim 1 in which the marker probe contacts the printed circuit board in unison with the test probes and marks the board while the test probes are in contact with the board.

4. Apparatus according to claim 1 in which the test probes are spring biased against the board during testing, and in which the marker probes is spring biased against the board in unison with the test probes.

5. Apparatus according to claim 4 in which the drive means comprises a drive motor with an output shaft that rotates about an axis, and in which the marker probe rotates about an eccentric axis relative to the axis of rotation of the drive motor output shaft to form the identifying mark on the board with a diameter related to the offset spacing of the marker probe relative to the output axis of the motor output shaft drive.

6. Apparatus according to claim 4 in which the marker probe is of sufficiently small size to mount within the array of test probes.

7. Apparatus according to claim 5 in which the spring biasing means and the duration of the test signal are coordinated and adjusted to control the depth of the identifying mark.

8. Apparatus according to claim 5 in which the drive motor is mounted within the test fixture housing to a probe plate of the test fixture on which the array of test probes are supported.

9. Apparatus according to claim 1 in which the marker probe drive means is operated in response to the test signal indicating that the board has passed the test.

10. Apparatus according to claim 1 in which the marker probe comprises an assembly which includes a drive motor having an output shaft for rotating the marker probe, a plunger that makes a sliding fit on an output shaft of the drive motor, in which the marker probe is secured to the plunger, a biasing spring contacting the plunger for spring biasing the plunger when the plunger moves axially relative to the output shaft of the drive motor, thereby providing spring-biased contact between the marker probe and the printed circuit board, and in which the plunger is secured to the drive motor output shaft so that operation of the marker probe drive rotates the output shaft to rotate the plunger and thereby rotate the marker probe as the marker probe is held in spring-biased contact with the printed circuit board.

11. Apparatus according to claim 10 in which the drive means comprises a drive motor with an output shaft that rotates about an axis, and in which the marker probe rotates about an eccentric axis relative to the axis of rotation of the drive motor output shaft to form the identifying mark on the board with a diameter related to the offset spacing of the marker probe relative to the output axis of the motor output shaft drive.

12. Apparatus according to claim 11 in which the marker probe contacts the printed circuit board in unison with the test probes.

13. In a test fixture for testing printed circuit boards of the type having a plastic surface layer, the test fixture comprising an array of electrically conductive test probes defining a test probe field disposed adjacent to a printed circuit board aligned with the test probe field, in which the test probes and the printed circuit board are moved toward each other and into contact for testing, said contact producing electrical test signals transmitted by the probes and sent to a test unit for producing a pass/fail signal output indicating that the board either passes or fails the test, the improvement comprising a marker probe mounted within the test probe field, means for holding the marker probe in spring-biased pressure contact with the board, means for rotating the marker probe in response to said pass/fail output signal, the marker probe comprising a chisel tip adapted to rotate over a two-dimensional area of the board while in spring pressure contact with the board for removing the plastic surface layer of the printed circuit board and thereby providing a permanent, visible identifying mark of the test result on the board.

14. Apparatus according to claim 13 in which the spring biasing means are contained in a housing for mounting the marker probe for biasing the chisel tip into spring contact with the board, the housing mounted to a probe plate of the test fixture that supports the test probes, and including drive means directly engaged with the marker probe within the boundary of the test probe field for rotating the chisel tip to form the identifying mark on the board.

15. Apparatus according to claim 14 in which the marker probe rotates about an eccentric axis relative to the axis of rotation of a drive motor output shaft coupled to the marker probe to form the identifying mark on the board with a diameter related to the offset spacing of the marker probe tip relative to the axis of the motor output shaft.

16. In a test fixture for testing printed circuit boards of the type having a plastic surface layer disposed over a conductive layer of metal, the test fixture comprising an array of electrically conductive test probes mounted within a test fixture housing and defining a test probe field disposed adjacent to a printed circuit board aligned with the test probe field, in which the test probes and the printed circuit board are moved toward each other and into contact for testing, said contact producing electrical test signals transmitted by the test probes and sent to a test unit for producing a pass/fail signal output indicating that the board either passes or fails the test, the improvement comprising a marker probe mounted within the test probe field, means for holding the marker probe in pressure contact with the board at the time that said pass/fail output signal is produced, means for rotating the marker probe in response to said pass-/fail output signal to produce an identifying mark on the board, the marker probe comprising a chisel tip coupled to a drive motor mounted within the test fixture housing for rotating the chisel tip, in which the marker probe is rotated about an eccentric axis relative to the axis of rotation of the drive motor output shaft to rotate over a two-dimensional area of the board while the chisel tip is in pressure contact with the board for thereby removing the plastic surface layer of the printed circuit board to expose the underlying metal layer and thereby provide a permanent visible identifying mark of the test result on the board, in which the identifying mark has a diameter related to the offset spacing of the marker probe chisel tip relative to the axis of the motor output shaft.

17. Apparatus according to claim 16 in which the drive motor for the chisel tip is mounted in the housing within the boundary of the test probe field.

* * * * *